United States Patent [19]

Frahm et al.

[11] Patent Number: 4,808,928

[45] Date of Patent: Feb. 28, 1989

[54] METHOD FOR RAPID ACQUISITION OF SPIN RESONANCE DATA FOR A SPATIALLY RESOLVED INVESTIGATION OF AN OBJECT

[75] Inventors: Jens Frahm; Wolfgang Hänicke; Klausdietmar Merboldt, all of Goettingen, Fed. Rep. of Germany

[73] Assignee: Max-Planck-Gesellschaft zur Foerderung der Wissenschaften e.V., Goettingen, Fed. Rep. of Germany

[21] Appl. No.: 117,795

[22] Filed: Nov. 5, 1987

[30] Foreign Application Priority Data

Nov. 7, 1986 [DE] Fed. Rep. of Germany ....... 3637998

[51] Int. Cl.[4] ............................................. G01R 33/20
[52] U.S. Cl. ..................................... 324/309; 324/314
[58] Field of Search ............... 324/307, 309, 312, 314; 128/653

[56] References Cited

U.S. PATENT DOCUMENTS

4,694,250  9/1987  Iwaoka et al. ....................... 324/309
4,740,749  4/1988  Yamamoto et al. ................. 324/309

OTHER PUBLICATIONS

Frahm et al, "Rapid Three-Dimensional MR Imaging Using the Flash Technique", J. of Computer Assisted Technology, vol. 10, No. 2, 1986.
Haase et al, "Dynamic Digital Subtraction . . . MR Movie Sequences", Radiology 1986; 160; 537–541.
Frahm et al, "Rapid NMR Imaging . . . Flash Technique", Magnetic Resonance in Medicine, vol. 3, pp. 321–327, 1986.
Haase et al, "Flash Imaging . . . Low Flip-Angle Pulses," J. of Magnetic Resonance, vol. 67, pp. 258–266, 1986.
Matthaei et al, "Regional Physiological . . . Magnetic Resonance Images", The Lancet, pp. 893, Oct. 19, 1985.
Oppelt et al, "FISP . . . Kernspintomographie", Electromedica 54, No. 1, 1986, pp. 15–18.
Gyngell et al, "The Application . . . 2D-FT MR Imaging", 5th Annual Meeting, Soc. of Magn. Res. in Medicine, Book of Abstracts, Aug. 1986.
Freeman et al, "Phase and Intensity . . . NMR", J. of Magnetic Resonance, vol. 4, 1971, pp. 366–383.
Pykett, "NMR Imaging in Medicine", Scientific American, May 1982, pp. 54–64.

*Primary Examiner*—Stewart J. Levy
*Assistant Examiner*—Kevin D. O'Shea
*Attorney, Agent, or Firm*—Frishauf, Holtz, Goodman & Woodward

[57] ABSTRACT

The "spoiled FLASH" nuclear magnetic resonance (NMR) method avoids image artifacts which may be caused by transverse magnetization remaining at the end of a TR period of a partial experiment by applying an additional "spoiler" slice gradient pulse ("SP") after the detection of a gradient echo ("Signal") and before the application of the radio frequency pulse (RF) of the following partial experiment. The amplitude-time integral, i.e. the duration and/or the amplitude of the additional spoiler slice gradient pulses is incremented and-/or decremented from partial experiment to partial experiment of a given total experiment. Each spoiler amplitude may be repeated after a time of the order of $T_2$.

24 Claims, 3 Drawing Sheets

(A) (B) (C) (D)

METHOD FOR RAPID ACQUISITION OF SPIN RESONANCE DATA FOR A SPATIALLY RESOLVED INVESTIGATION OF AN OBJECT

BACKGROUND OF THE INVENTION

I. Field of the Invention

The present invention relates generally to magnetic spin resonance methods, more specifically nuclear magnetic resonance (NMR) methods. It is concerned with the acquisition of data for the formation of two and three dimensional images of the spin density distribution in a material containing electron or nuclear spins.

II. Description of the Prior Art

NMR imaging is a relatively new technique for obtaining cross-sectional pictures through the human body (and other objects) without exposing the body to ionizing radiation, see e.g. the article "NMR Imaging in Medicine" by Ian L. Pykett in SCIENTIFIC AMERICAN, May 1982, pp. 54 to 64.

In U.S. patent application No. 828,956 to Frahm et al, now U.S. Pat. No. 4,707,658, incorporated herein by reference thereto, there is described a NMR method which has become known as fast low angle shot (FLASH) method. In typical embodiments of the FLASH method, only a fraction of the spins which are aligned in a Z direction by a constant magnetic field, are tilted or "flipped" by a space selective radio frequency (rf) pulse having a flip angle less than 90 degrees into an XY plane and the flipped spins are utilized as completely as possible to generate a gradient echo signal by gradient switching. Typically, flip angles between about 5 and 60 degrees are used which yield an optimum spin density or $T_1$ contrast. Repetition rates with TR periods down to only 20 milliseconds and less are possible.

The FLASH method utilizes an at least approximate equilibrium state of the longitudinal or Z magnetization which is established by the train of "fractional rf pulses" having the specified small flip angles. The transverse magnetization in the XY plane can be neglected if the spin-spin relaxation time $T_2$ is in the order of e. g. 100 milliseconds and less which applies to most tissues in vivo. However, some tissues and body fluids, as the cerebrospinal liquid, exhibit $T_2$ values of 1 second and longer. In such cases some transverse magnetization remains at the end of the TR period of each partial experiment and this remaining transverse magnetization is transformed by the next rf pulse into an undesirable phase coherence so that it manifests itself as a spurious spin echo or stimulated echo. These SSFP type signals (SSFP=Steady State Free Procession) cause artifacts in rapid NMR images of the brain and the like. It has been proposed in an article "Phase and Intensity Anomalies in Fourier Transform NMR" by Freeman et al. in JOURNAL OF MAGNETIC RESONANCE 4, 366-383 (1971) in connection with a method of obtaining Fourier transform spectra (i. e. a non-imaging NMR method), to destroy spurious transverse magnetizations occurring after repeated rf excitation, by field gradient pulses which have a randomly varying amplitude or duration and prevent refocussing. This known device cannot be used in combination with the FLASH method, since gradient pulses having randomly varying amplitudes would cause inacceptable image distortions which are believed to be produced by induced eddy currents.

A modification of the FLASH imaging method, known as the FISP method, in which the spurious transverse magnetization remaining at the end of a partial experiment is refocussed by repeating, in reverse order, all of the gradient pulses is disclosed in a publication by Oppelt et al. "FISP: Eine neue schnelle Pulssequenz für die Kernspin-Tomographie" (FISP: A new fast pulse sequence for NMR imaging) in Electromedica 54, 16-18 (1986). However, this increases the measuring time and eliminates $T_1$ contrast capabilities.

SUMMARY OF THE INVENTION

It is an object of the invention to avoid the interference caused by spurious transverse magnetization which in case of large $T_2$ values may remain after each TR period of a FLASH method employing spatially selective fractional pulses, and to maintain a high image quality essentially without increasing the TR period.

Preferred embodiments of the present "Spoiled FLASH" method employ additional slice gradient pulses which are applied between the end of the data acquisition and the start of the next partial experiment, the amplitude-time integral of these additional slice gradient pulses being varied by steps monotonously increasing or decreasing from partial experiment to the other. The additional slice gradient pulses may have a constant duration and an amplitude which varies monotonically step by step, or a constant amplitude and a duration which varies monotonically step by step, or amplitude and duration may vary from partial experiment to partial experiment such that the amplitude-time integral varies monotonically from partial experiment to partial experiment. When the duration of the additional slice gradient pulses is varied, the repetition period, i. e. the duration TR of the individual partial experiment can be kept constant or can be varied corresponding to the variation of the duration of the additional gradient pulses.

The efficacy of the spoiler gradient pulses increases with the integral of the increment. Since transverse coherences decay with $T_2$, particular spoiling gradient amplitudes may be repeated after, e. g. 1 to 2 $T_2$ within the same total experiment. This allows more complex, e.g. zig-zag schemes for the spoiler amplitudes within a total experiment in order to maximize the spoiler increment or decrement for a given gradient power available on a particular system.

The additional "spoiler" slice gradients which are incremented or decremented in the course of a total experiment prevent a degradation of the image by residual transverse magnetization components. It is believed that the additional, monotonically varied slice gradients rotate the spurious transverse magnetization out of the imaged region, e. g. an imaged slice, so that it cannot produce undesirable visible image artifacts.

Thus, the present additional slice gradient pulses, in contrast to the known randomly varying spoiler pulses, do not cause image artifacts without increasing the data acquisition time.

In a modification the spoiler slice gradient pulses are applied only every second partial experiment, or more generally not in all of the partial experiments.

BRIEF DESCRIPTION OF THE DRAWINGS

In order that the invention may be more fully understood and further objects and advantages thereof may be appreciated, reference will now be made to the following description taken in connection with the accompanying drawings in which.

DESCRIPTION OF PREFERRED EMBODIMENTS

Figure 1:
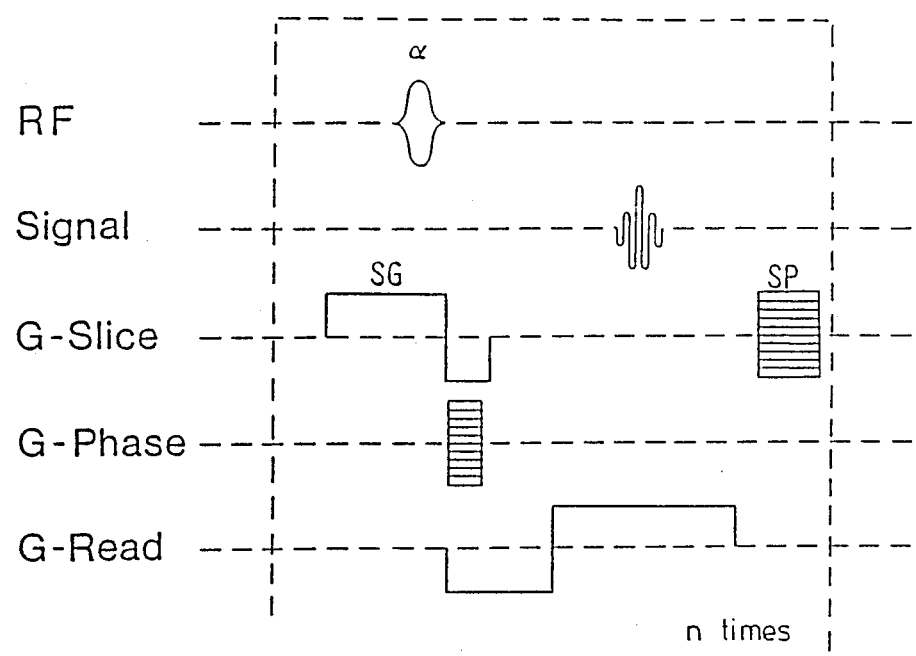
FIG. 1 is a diagram of a partial experiment of a preferred embodiment of the present method for generating data for a cross-sectional image; the diagram showing from top to bottom;
   RF: The amplitude envelope of a selective rf pulse,
   Signal: A gradient echo,
   G-slice: The amplitude of a slice selection magnetic field gradient,
   G-phase: The amplitude of a phase encoding magnetic field gradient, and
   G-read: The amplitude of a frequency encoding ("read") magnetic field gradient, each schematically shown as a function of time.

FIG. 1 is an idealized diagram of one of a number n of partial experiments of a total experiment and shows a (slice) selective radio frequency pulse RF, the flip angle of which being smaller than 90 degrees, preferably between 5 and 60 degrees as taught in the above identified U.S. patent to Frahm et al. Further shown is a gradient echo "Signal", from which a plurality of samples for processing into an image is derived by sampling as known in the art. In the third line from the top, a slice gradient field pulse sequence ("G-slice") is shown which comprises a slice gradient pulse SG coinciding in time in part with the rf pulse RF, and a "spoiler" slice gradient pulse SP which is applied after the termination of the sampling of the gradient echo signal. The partial experiment sequence further comprises a phase encoding gradient pulse "G-phase" and a read pulse "G-read". The representations of the spoiler gradient pulse SP and of the phase encoding gradient pulse means, as usual in the art, that the amplitude of the respective gradient pulses varies from partial experiment to partial experiment within a predetermined total experiment.

The pulse sequence of the partial experiment shown within the dashed box of FIG. 1 is repeated n times within a total experiment; the duration of each partial experiment is TR. Thus, the number of the different amplitudes of the phase coding gradient pulses and of the spoiler gradient pulses is generally equal to the number n of the partial experiments comprised by a total experiment.

The pulse sequence of the partial experiment shown in FIG. 1 corresponds to the prior art (FIG. 3 of the above mentioned United States patent) with the exception of the spoiler gradient pulse applied to the sample or object under investigation between the gradient echo "signal" and the beginning of the next partial experiment i. e. the next following RF pulse. The spoiler gradient pulse is produced in the same direction, thus, most conveniently by the same gradient coil, as the slice gradient pulse SG which is applied simultaneously with the selective high frequency pulse RF. The variation of the amplitude (or more generally the amplitude-time integral) of the spoiler slice gradient pulse SP in small steps from partial experiment to partial experiment does not cause perceptible image interferences due to eddy currents or the like. On the other hand, the sequence of spoiler slice gradient pulses SP avoids the generation of disturbing image artifacts from remaining transverse magnetization. It is assumed that the varied spoiler slice gradient pulses SP remove the remaining spurious magnetization in the phase space from the imaged region rather than destroying such transverse magnetization.

It is generally of advantage, to make the maximum value of the amplitude-time integral of the spoiler slice gradient pulses SP larger than the maximum value of the phase gradient pulse G-phase.

The interference effects caused by the transverse magnetization remaining at the end of a partial experiment in case of long $T_2$ periods become less noticable with smaller flip angles. However, relatively large flip angles, e.g. of the order of 45 degrees, are desirable in many cases. The benefits of the invention are specifically important in case of such large flip angles and triggered versions of the FLASH method.

"Triggered" means that the NMR data acquisition sequence is synchronized with an externally registered periodic movement, e.g. by means of an ECG signal for the heart beat, such that the signals of partial experiments with the same phase encoding magnet field gradient are detected always at the same point of time during the period of the movement. For dynamic investigations of the heart, generally 32 partial experiments are performed with the same phase coding gradient sequentially after triggering by the ECG signals. The 128 or 256 partial experiments with different phase encoding gradients, which are needed for the computerized image reconstruction, are performed during 128 or 256 corresponding further heart beat cycles. The result are e.g. 32 images corresponding to 32 points of time within the heart beat cycle with a distance in time determined by the repetition period TR, e.g. 20 to 30 milliseconds. Corresponding investigations of ECG dependent physiological events in other organs, e.g. the flow of blood within the brain are possible. A drawback of the prior art is that the magnet field gradients are switched in the same way during each of the 32 partial experiments. This gives rise to a refocussing effect for any remaining transverse magnetization analog to the FISP method with the result that the contrast behaviour deteriorates with time. Such a refocussing can be avoided by switching a spoiler gradient in slice direction which is incremented 32 times for example.

Three-dimensional measurements are another example for the application of the present spoiler gradient. In this case, a broad "slice" is selected by means of a short rf pulse and/or a small slice gradient. The spatial resolution in slice direction within said wide slice is achieved by additively superimposing a phase encoding gradient onto the generally polarity-reversed portion of the slice gradient This second phase encoding gradient is incremented or decremented independently of the first phase encoding gradient "G-phase" from partial experiment to partial experiment. According to the invention, artifacts are prevented by switching a spoiler gradient in slice direction analogous to the two-dimensional case.

Figure 2:
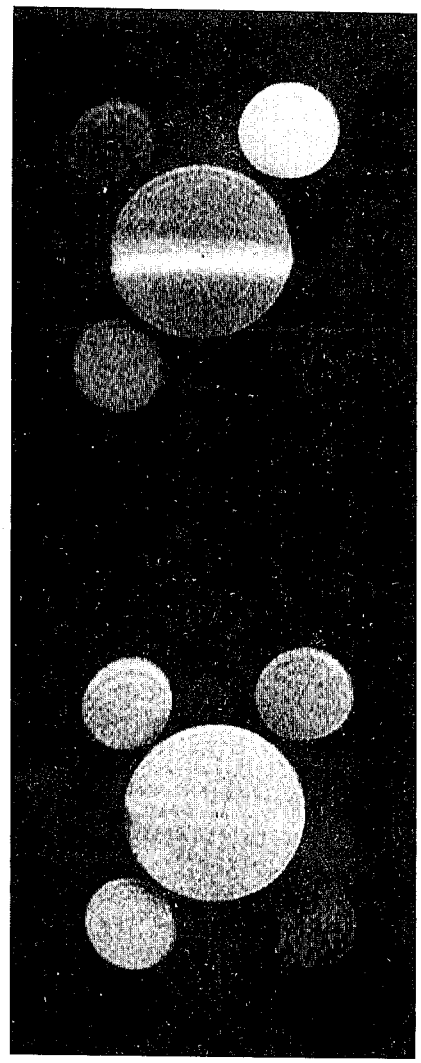
FIG. 2 are NMR images of a water phantom for comparing the prior art with the method of FIG. 1.
Figure 2:
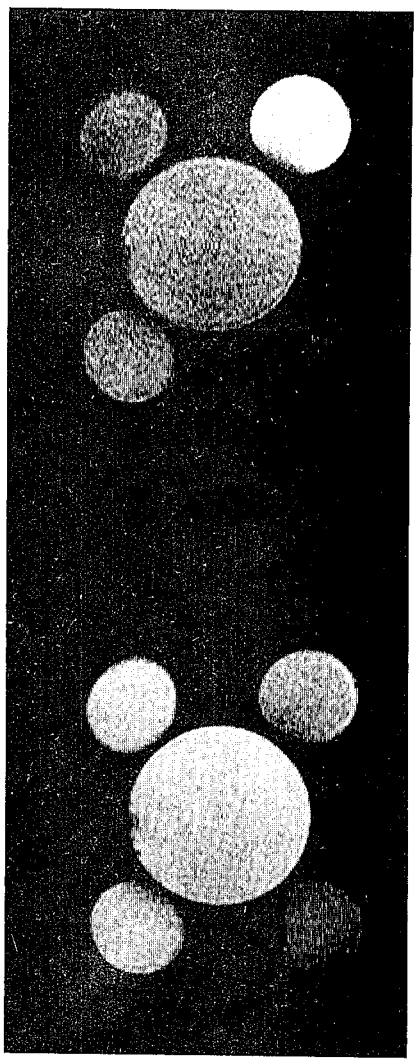

FIG. 2 shows cross-sectional NMR images of a phantom consisting of liquid-filled tubes. The data for the images (A) and (B) were derived with the version of the FLASH method known from FIG. 3 the above mentioned U.S. patent to Frahm et al. The data for the images (C) and (D) were derived by the embodiment of the invention disclosed with reference to FIG. 1. The images (A) and (B) of FIG. 2 were made using a flip angle of about 15 degrees, the images (B) and (D) using a flip angle of about 90°. The images were made with an NMR apparatus supplied by Bruker, Karlsruhe, Federal Republic of Germany which has a magnet with a bore of 40 cm diameter and a field strength $B_0$ of 2.35 Tesla (T).

The tubes contained liquids with different $T_1$ and $T_2$ relaxation times, i.e. top left ethanol; top right methanol (each long $T_1$, short $T_2$); in the middle distilled water (long $T_1$ and $T_2$); left bottom benzene (very long $T_1$, short $T_2$); and bottom right a vegetable oil (medium values of $T_1$ and $T_2$).

It is obvious from image B in FIG. 2, that long $T_2$ relaxation times and large flip angles produce strong artifacts which manifest itself in the image of the water-filled middle tube as a wide vertical white stripe. These artifacts may be reduced by using small flip angles, as 15 degrees (image A), however, with the compromise of a smaller $T_1$ contrast and smaller signal-to-noise ratio and/or longer repetition periods TR, e.g. 100 milliseconds with the effect of longer measuring times.

Figure 3:
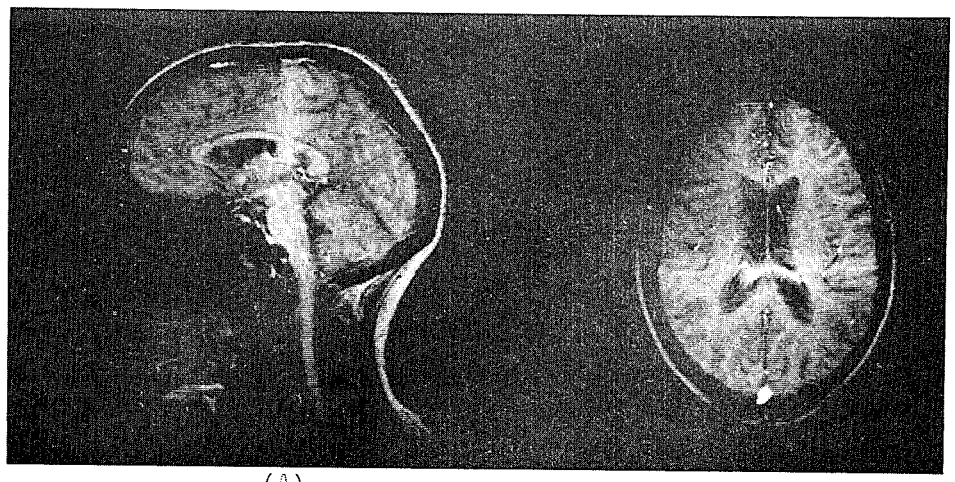
FIG. 3 are cross-sectional images of a human head in vivo for comparing the prior art with the method of FIG. 1.
Figure 3:

FIG. 3 shows images (A) and (B) of a human head made in accordance with the prior art and images (C) and (D) obtained with the embodiment of the invention explained with reference to FIG. 1. The images were made in vivo with an NMR apparatus manufactured by Siemens, Erlangen, F. R. Germany. All of the four images were made with a flip angle of 60°. The artifacts in form of a vertical and horizontal lighter stripe in the images (A) and (B) are already produced with smaller flip angles.

The above described embodiments of the present "Spoiled FLASH" method can be modified and adapted to procedures, in which the measurement data are derived according to a projection-reconstruction algorithm, rather than according to a 2D-FT algorithm, and processed to images by a computer. In such a case, the read gradient pulses G-Read and the phase coding gradient pulses G-Phase are replaced by first and second read gradient pulses, the amplitudes of which are incremented synchronously according to sine and cosine functions, respectively, from partial experiment to partial experiment, to rotate a resulting "effective" read gradient around the object region to be investigated.

An embodiment of this modification is a method of rapid acquisition of spin resonance data according to a projection-reconstruction algorithm, for a space-resolved investigation of a region of an object which comprises atomic spins exhibiting a predetermined spin-lattice relaxation time $T_1$, a predetermined spin-spin relaxation time $T_2$ and a predetermined effective spin-spin relaxation time $T_2^*$, said method comprising (a) positioning said region in a homogeneous magnetic field to align said spins into a predetermined direction, (b) applying a selective radio-frequency pulse RF to said region to tilt said spins by a predetermined flip angle out of said predetermined direction, (c) applying to said region a slice selective magnetic field gradient pulse coinciding in part with said radio-frequency pulse, (d) performing at least once the following series of three steps after the termination of said radio frequency pulse:

(aa) inverting the polarity of the slice selection gradient, (bb) maintaining the reversed slice selection gradient for a predetermined period of time to refocus dephased magnetizations during radio frequency excitation, (cc) switching off slice selection gradient before detection of a gradient echo (step e), (dd) applying first and second read gradients G-read 1, G-read 2, each having a predetermined polarity and a predetermined duration, to said object region, said read gradients having directions which are essentially normal to each other, (ee) reversing the polarity of said read gradients to produce a gradient echo signal, (ff) maintaining the read gradients of reversed polarity for a predetermined period of time;

(e) detecting the gradient echo produced by the polarity reversal of the read gradients, (f) switching off each read gradient, said steps (b) to (f) comprising one partial experiment, (g) repeating a plurality n of times the steps (b) to (f), wherein (gg) a predetermined interval is allowed between the read pulse switching off time (step f) of a given partial experiment, and the application of the radio-frequency pulse RF of the next following partial experiment, said interval being essentially shorter than said spin-lattice relaxation time $T_1$.

(hh) no more than three magnetic field gradients are applied which are essentially normal to each other, (ii) the amplitudes of said first and second read gradients are synchronously varied according to sine and cosine functions, respectively, from partial experiment to partial experiment to rotate a resulting read gradient around said object region, An additional slice gradient pulse SP is applied after the detecting step (e) of a partial experiment and before the high frequency pulse RF of the next following partial experiment, said additional slice gradient pulse SP having a predetermined amplitude-time integral, and the amplitude-time integral of the additional slice gradient pulse SP is incremented and/or decremented monotoneously step by step in the course of the repetitions of said partial experiments within a total experiment, e.g. in a zig-zag manner.

In all embodiments, the steps of the amplitude-time integral of the additional "spoiler" gradient pulses may be of equal magnitude.

Various modifications of the above described preferred embodiments will occur to those skilled in the art.

We claim:

1. A method of rapid acquisition of spin resonance data for a space-resolved investigation of a region of an object which comprises atomic spins exhibiting a predetermined spin-lattice relaxation time $T_1$, a predetermined spin-spin relaxation time $T_2$ and a predetermined effective spin-spin relaxation time $T_2^*$, said method comprising (a) positioning said region in a homogeneous magnetic field to align said spins into a predetermined direction, (b) applying a selective radio-frequency pulse (RF) to said region to tilt said spins by a predetermined flip angle out of said predetermined direction, (c) applying to said region at least a slice-selection magnetic field gradient (G-slice) in a first (slice) direction and an encoding magnetic field gradient (G-phase) in a second (phase) direction, (d) performing at least once the following series of steps after the termination of said radio frequency pulse:

(aa) reversing the polarity of the slice selection gradient, (bb) maintaining the reversed slice selection gradient for a predetermined period of time to refocus dephased magnetization during radio frequency excitation, (cc) switching off the slice selection gradient before detection of a gradient echo (step e), (dd) applying a read gradient (G-read) of a predetermined polarity and a predetermined duration to said object region, (ee) reversing the polarity of said read gradient to produce a gradient echo signal, (ff) maintaining the read gradient of reversed polarity for a predetermined period of time;

(e) detecting the gradient echo produced by the polarity reversal of the read gradient, (f) switching off the read gradient, said steps (b) to (f) comprising one partial experiment, (g) repeating a plurality n of times the steps (b) to (f), wherein (gg) a predetermined interval is allowed between the read gradient switching off time (step f) of a given partial experiment, and the application of the radio-frequency pulse (RF) of a subsequent partial experiment, said interval being essentially shorter than said spin-lattice relaxation time ($T_1$), (hh) no more than three magnetic field gradients are applied which are essentially normal to each other, (ii) each encoding gradient (G-phase and/or G-slice for three-dimensional measurements) is switched off before the detecting step (e), characterized in that (h) an additional slice gradient pulse (SP) is applied after the detecting step e) of a partial experiment and before the radio frequency pulse (RF) of the next following partial experiment, said additional slice gradient pulse (SP) having a predetermined amplitude-time integral, and (i) said amplitude-time integral of said additional slice gradient pulse (SP) is varied monotonically step by step in the course of said repeating of said partial experiments to partial experiment within at least a portion of a total experiment.

2. The method as claimed in claim 1, wherein a particular amplitude-time integral of said additional slice gradient pulses is repeated after a time of the order of $T_2$ within a total experiment.

3. The method as claimed in claim 1, wherein the variation of the amplitude-time integral of the additional slice gradient pulses is an incrementation.

4. The method as claimed in claim 1, wherein said variation of the amplitude-time integral of said additional slice gradient pulses is a decrementation.

5. The method of claim 1, wherein the duration of said additional slice gradient pulse (SP) is constant within a total experiment.

6. The method of claim 1, wherein the duration of said additional slice gradient pulse is varied step by step within a total experiment.

7. The method of claim 1, wherein the amplitude of said additional slice gradient pulse is varied within a total experiment.

8. The method as claimed in claim 1, the amplitude and the duration of said additional slice gradient pulses are varied step by step within a total experiment.

9. The method as claimed in claim 6, wherein the duration (TR) of said partial experiments is varied corresponding to the variation of the duration of said additional slice gradient pulses.

10. The method as claimed in claim 1, wherein said flip angle is smaller than 75 degrees.

11. The method as claimed in claim 1, wherein said flip angle is smaller than 60 degrees.

12. The method as claimed in claim 1, wherein said flip angle is larger than 30 degrees.

13. The method as claimed in claim 1 in which each partial experiment comprises the application of a phase encoding gradient pulse (G-phase), the magnitude of the amplitude-time integral of which being varied from partial experiment to partial experiment and assumes a predetermined maximum value in a total experiment, characterized in that the amplitude-time integral of said additional slice gradient pulses (SP) assumes a predetermined maximum value within a given total experiment, said maximum value being larger than the maximum value of the phase encoding gradient pulse.

14. The method as claimed in claim 1, wherein said amplitude-time integral is varied at each of said plurality of repetitions.

15. The method of claim 12 wherein said flip angle is between about 15 and 60 degrees.

16. The method as claimed in claim 1, wherein said flip angle is between about 5 and 60 degrees.

17. The method of claim 1, wherein said amplitude-time integral is varied in equal steps.

18. The method of claim 1, wherein said amplitude-time integral of said additional pulses is varied in a zigzag manner.

19. A method of rapid acquisition of spin resonance data according to a projection-reconstruction algorithm, for a space-resolved investigation of a region of an object which comprises atomic spins exhibiting a predetermined spin-lattice relaxation time $T_1$, a predetermined spin-spin relaxation time $T_2$ and a predetermined effective spin-spin relaxation time $T_2^*$, said method comprising (a) positioning said region in a homogeneous magnetic field to align said spins into a predetermined direction, (b) applying a selective radio-frequency pulse (RF) to said region to tilt said spins by a predetermined flip angle out of said predetermined direction, (c) applying to said region magnetic field gradients in mutually essentially normal directions, said gradients including a slice selection gradient, (d) performing at least once the following series of steps after the termination of said radio frequency pulse:

(aa) reversing the polarity of said slice selection gradient, (bb) maintaining the reversed slice selection gradient for a predetermined period of time to refocus dephased magnetization during rf excitation, (cc) switching off the slice selection gradient before detection of a gradient echo (step e), (dd) applying a first and a second read gradient (G-Read, G-Phase) of predetermined polarities and predetermined durations to said object region, (ee) reversing polarities of said read gradients to produce a gradient echo signal, (ff) maintaining the read gradients of reversed polarities for a predetermined period of time;

(e) detecting the gradient echo produced by the polarity reversal of the read gradients, (f) switching off each read gradient, said steps (b) to (f) comprising one partial experiment, (g) repeating a plurality n of times the steps (b) to (f), wherein (gg) a predetermined interval is allowed between the read gradient switching off time (step f) of a given partial experiment, and the application of the radio-frequency pulse (RF) of the next following partial experiment, said interval being essentially shorter than said spin-lattice relaxation time ($T_1$), (hh) no more than three magnetic field gradients are applied which are essentially normal to each other, (ii) the amplitudes of said first and second read gradients are synchronously varied according to sine and cosine functions, respectively from partial experiment to partial experiment to rotate a resulting read gradient around said object region, and wherein an additional slice gradient pulse (SP) having a predetermined amplitude-time integral is applied after the detecting step (e) of a partial experiment and before the radio frequency pulse (RF) of the next following partial experiment, and the amplitude-time integral of the additional slice gradient pulse (SP) is varied monotonically step by step in the course of the repetitions of said partial experiments within at least a portion of a total experiment.

20. The method of claim 19, wherein said flip angle is less than 75 degrees.

21. The method of claim 19, wherein a particular amplitude-time integral of said additional pulses is repeated after a time in the order of $T_2$ within a total experiment.

22. The method of claim 19, wherein said variation of the amplitude-time integral of said additional pulses is an incrementation.

23. The method of claim 19, wherein said variation of said amplitude-time integral of said additional pulses is a decrementation.

24. The method of claim 19, wherein said amplitude-time integral is varied in equal steps.

* * * * *